United States Patent
Chang Chien et al.

(10) Patent No.: US 10,522,512 B2
(45) Date of Patent: Dec. 31, 2019

(54) SEMICONDUCTOR PACKAGE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 0 days.

(21) Appl. No.: 15/968,769

(22) Filed: May 2, 2018

(65) Prior Publication Data

US 2019/0341369 A1    Nov. 7, 2019

(51) Int. Cl.
*H01L 25/065* (2006.01)
*H01L 25/00* (2006.01)
(Continued)

(52) U.S. Cl.
CPC ...... *H01L 25/0657* (2013.01); *G01R 31/2853* (2013.01); *G01R 31/2896* (2013.01); *H01L 22/12* (2013.01); *H01L 23/5383* (2013.01); *H01L 23/5386* (2013.01); *H01L 23/5389* (2013.01); *H01L 25/50* (2013.01); *H01L 2225/0651* (2013.01); *H01L 2225/06506* (2013.01); *H01L 2225/06562* (2013.01); *H01L 2225/06586* (2013.01); *H01L 2225/06596* (2013.01)

(58) Field of Classification Search
CPC ............ H01L 25/0657; H01L 23/5383; H01L 23/5386; H01L 23/5389; H01L 25/50

USPC ........................................................ 257/657
See application file for complete search history.

(56) References Cited

U.S. PATENT DOCUMENTS

| 8,664,780 B2 | 3/2014 | Han et al. |
| 2007/0045876 A1* | 3/2007 | Onodera ............... H01L 21/568 257/790 |
| 2017/0358559 A1 | 12/2017 | Ye et al. |

FOREIGN PATENT DOCUMENTS

| CN | 203277370 | 11/2013 |
| TW | 201643996 | 12/2016 |

(Continued)

OTHER PUBLICATIONS

"Notice of Allowance of Taiwan Counterpart Application," dated Aug. 8, 2019, p. 1-p. 4, in which the listed references were cited.

*Primary Examiner* — Elias Ullah
(74) *Attorney, Agent, or Firm* — JCIPRNET

(57) ABSTRACT

A semiconductor package including an ultra-thin redistribution structure, a semiconductor die, a first insulating encapsulant, a semiconductor chip stack, and a second insulating encapsulant is provided. The semiconductor die is disposed on and electrically coupled to the ultra-thin redistribution structure. The first insulating encapsulant is disposed on the ultra-thin redistribution structure and encapsulates the semiconductor die. The semiconductor chip stack is disposed on the first insulating encapsulant and electrically coupled to the ultra-thin redistribution structure. The second insulating encapsulant is disposed on the ultra-thin redistribution structure and encapsulates the semiconductor chip stack and the first insulating encapsulant. A manufacturing method of a semiconductor package is also provided.

12 Claims, 18 Drawing Sheets

(51) Int. Cl.
*H01L 21/66* (2006.01)
*H01L 23/538* (2006.01)
*G01R 31/28* (2006.01)

(56) References Cited

FOREIGN PATENT DOCUMENTS

| | | |
|---|---|---|
| TW | 201714267 | 4/2017 |
| TW | 201727774 | 8/2017 |
| TW | I603404 | 10/2017 |
| TW | 201810600 | 3/2018 |

* cited by examiner

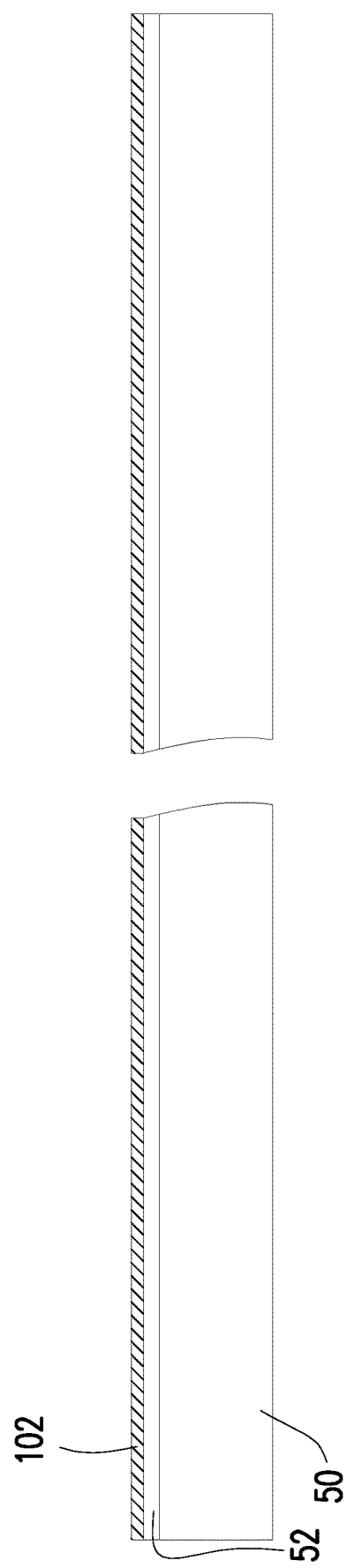

SEMICONDUCTOR PACKAGE AND MANUFACTURING METHOD THEREOF

BACKGROUND OF THE INVENTION

1. Field of the Invention

The invention relates to a semiconductor package and a manufacturing method, in particular, to a semiconductor package having an ultra-thin redistribution structure and a manufacturing method thereof.

2. Description of Related Art

Semiconductor package technology has been progressed in recent years with advancement of the technology. Currently marketing demanding for smart phone, consumers and wearable devices is always light, thin, short and small. Thus, the developing trend of advanced packaging always follows marketing demand and tries hard to keep reducing integrated circuit (IC) package form factor and package height. Moreover, in order to meet the current demand for the multi-functional semiconductor package, a technique of stacking chips has been used to provide semiconductor package that provide a large capacity to store or process data. In the multi-chip packaging field, and in accordance with a rapid increase in demand for multi-functional electronic components, miniaturizing the multi-chip package while maintaining the process simplicity is a challenge to researchers in the field.

SUMMARY OF THE INVENTION

The disclosure provides a semiconductor package and a manufacturing method thereof, which effectively reduce the package height.

The disclosure provides a semiconductor package including an ultra-thin redistribution structure, a semiconductor die, a first insulating encapsulant, a semiconductor chip stack, and a second insulating encapsulant. The semiconductor die is disposed on the ultra-thin redistribution structure and electrically coupled to the ultra-thin redistribution structure. The first insulating encapsulant is disposed on the ultra-thin redistribution structure and encapsulates the semiconductor die. The semiconductor chip stack is disposed on the first insulating encapsulant and electrically coupled to the ultra-thin redistribution structure. The second insulating encapsulant is disposed on the ultra-thin redistribution structure and encapsulates the semiconductor chip stack and the first insulating encapsulant.

The disclosure provides a manufacturing method of a semiconductor package. The method includes at least the following steps. An ultra-thin redistribution structure is formed. A circuit test is performed on the ultra-thin redistribution structure. A semiconductor die is disposed on the ultra-thin redistribution structure to electrically couple to the ultra-thin redistribution structure. A semiconductor chip stack and a first insulating encapsulant are formed on the ultra-thin redistribution structure, wherein the first insulating encapsulant is formed on a backside of the semiconductor chip stack to encapsulate the semiconductor die, and the semiconductor chip stack is electrically coupled to the ultra-thin redistribution structure. A second insulating encapsulant is formed on the ultra-thin redistribution structure to encapsulate the semiconductor ship stack and the first insulating encapsulant.

Through the above technical means, the disclosure is able to achieve the semiconductor package miniaturization. The ultra-thin redistribution structure of the semiconductor package is conducive to reduce the total height of the semiconductor package. In addition, a circuit test is performed on the ultra-thin redistribution structure before die bonding to avoid die loss, which is important for high-end device and stacking memory application. Accordingly, the fabrication of the semiconductor package would result in better stability and yield.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1A to FIG. 1K are schematic cross-sectional views illustrating a manufacturing method of a semiconductor package according to an embodiment of the disclosure.

DESCRIPTION OF THE EMBODIMENTS

Figure 1B:
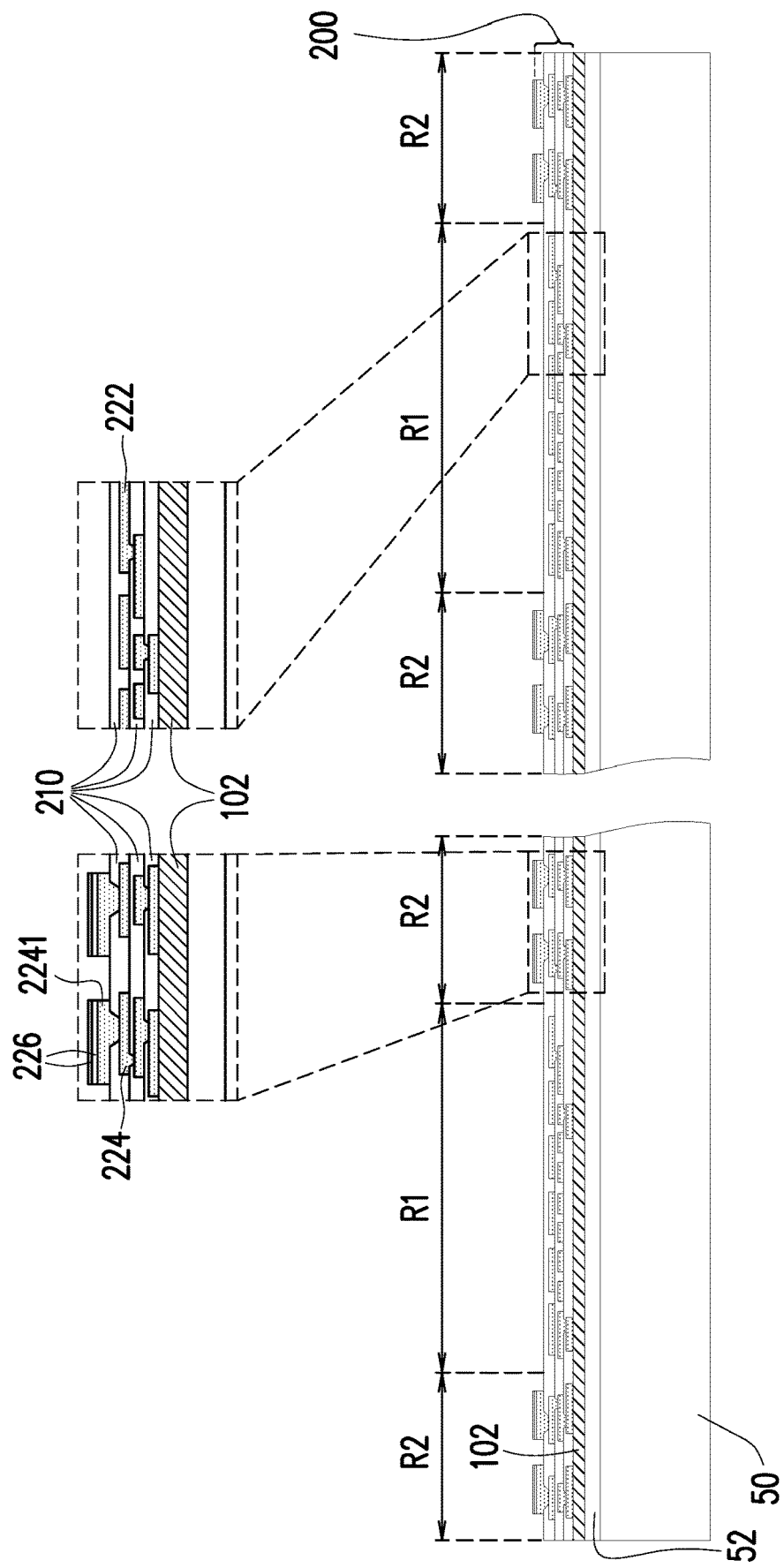

Reference will now be made in detail to the present preferred embodiments of the disclosure, examples of which are illustrated in the accompanying drawings. Wherever possible, similar reference numbers are used in the drawings and the description to refer to similar or like parts.

FIG. 1A to FIG. 1K are schematic cross-sectional views illustrating a manufacturing method of a semiconductor package according to an embodiment of the disclosure. Referring to FIG. 1A, a conductive layer 102 is formed on a first temporary carrier 50. The first temporary carrier 50 may be a wafer support system (WSS), or a panel support system (PSS), which is not limited thereto. In some embodiments, in order to enhance the releasibility of the conductive layer 102 from the temporary carrier 50 in the subsequent process, a release layer 52 may be formed on the first temporary carrier 50. The release layer 52 may be a LTHC (light to heat conversion) adhesive layer, or other suitable adhesive layers. The first temporary carrier 50 may be made of Flame Retardant, class 4 (FR-4), Bismaleimide Triazine (BT), ceramics, glass, silicon, or other suitable materials, which have suitable coefficient thermal expansion (CTE) for controlling warpage. Other suitable carrier materials might be adapted as the first temporary carrier 50 as long as the material is able to withstand the subsequent process while carrying the semiconductor package formed thereon. In some embodiments, a material of the conductive layer 102 may include titanium, copper, or a combination thereof, which is not limited thereto. The conductive layer 102 may be formed by a physical vapor deposition (PVD) process, a plating process, or other suitable processes. In some embodiments, the conductive layer 102 may be referred to the seed layer.

Referring to FIG. 1B, an ultra-thin redistribution structure 200 is formed on the conductive layer 102. For example, the ultra-thin redistribution structure 200 includes a first region R1 and a second region R2 connected to the first region R1.

In some embodiments, the first regions R1 and the second regions R2 may be arranged alternately. The ultra-thin redistribution structure 200 may be a fan-out redistribution layer including a dielectric layer 210, a first conductive pattern 222 formed in the first region R1 and a second conductive pattern 224 formed in the second region R2. The first conductive pattern 222 and the second conductive pattern 224 may be disposed on the conductive layer 102 and embedded in the dielectric layer 210. For example, a conductive material (e.g. copper, nickel, gold, etc.) is formed and patterned on the conductive layer 102 by a photolithography and an etching process, or other suitable processes to form the first conductive pattern 222 in the first region R1 and the second conductive pattern 224 in the second region R2. Next, a dielectric material (e.g. silicon oxide, silicon nitride, polyimide, benezocyclobutene (BCB), etc.) is formed on the conductive layer 102 to cover the first conductive pattern 222 and the second conductive pattern 224. Subsequently, a portion of the dielectric material may be removed to form openings (not illustrated) for exposing at least a portion of the second conductive pattern 224 and/or a portion of the first conductive pattern 222. The forming sequence of the dielectric layer 210 and the conductive layer construes no limitation in the disclosure.

The abovementioned steps may be performed multiple times to obtain a multi-layered redistribution structure as required by the circuit design. In some embodiments, the second conductive pattern 224 may include a plurality of conductive pads 2241 formed on the topmost dielectric layer 210. In some embodiment, a first metallic layer 226 may be formed on the conductive pads 2241 of the second conductive pattern 224 for subsequent wire bonding process. For example, the first metallic layer 226 may include copper, nickel, gold, a combination thereof, or other suitable materials.

In some embodiments, a thickness of the ultra-thin redistribution structure 200 ranges from about 20 μm to about 60 μm. A Young's modulus of the dielectric layer 210 may range from about 2.0 GPa to about 4.0 GPa. In some embodiments, the ultra-thin redistribution structure 200 has a fine line circuitry with a line and space (L/S) dimension of about 2 μm to about 10 μm. Compared with the conventional organic substrate, the ultra-thin redistribution structure 200 provides the electrical connection function with thinner structure and finer L/S dimension.

In some embodiments, after forming the ultra-thin redistribution structure 200, the conductive layer 102 is electrically coupled to the first conductive pattern 222 and the second conductive pattern 224, and a circuit test (such as an open circuit test) is performed to detect the electrical discontinuity of the ultra-thin redistribution structure 200 through the conductive layer 102.

Figure 1C:
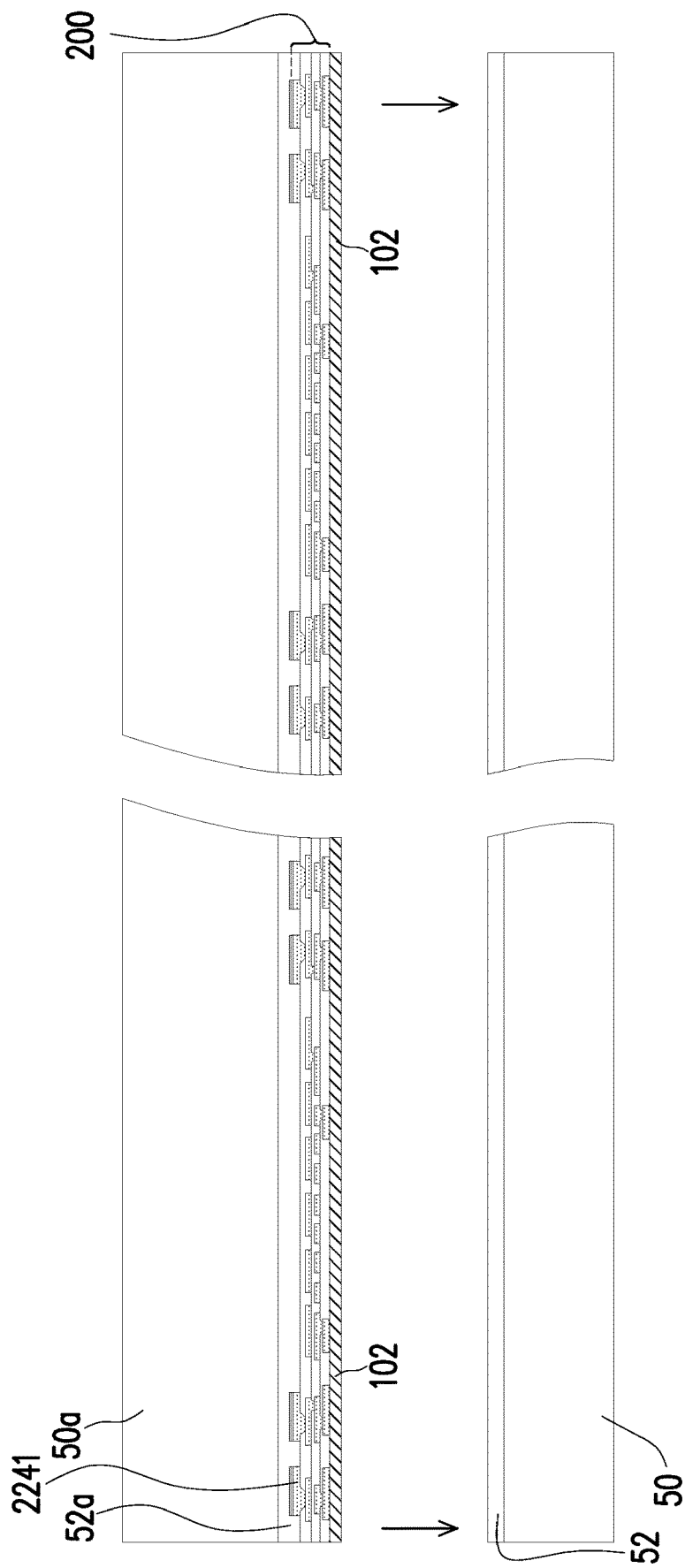
Figure 1D:
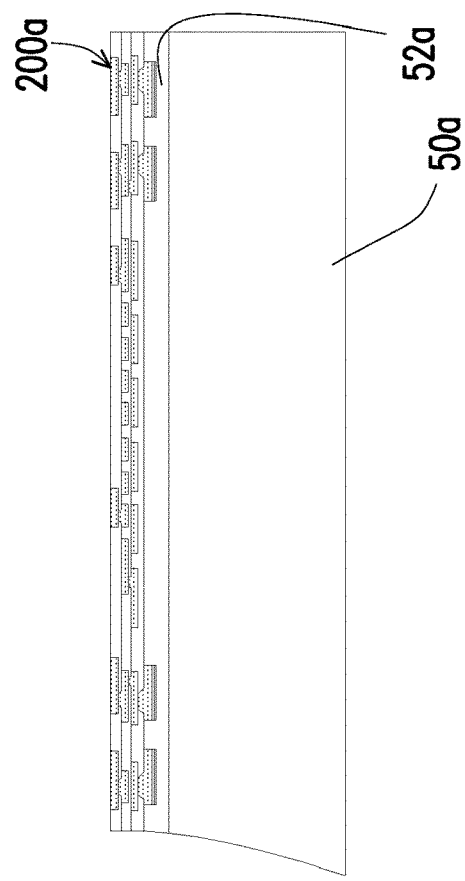
Figure 1D:
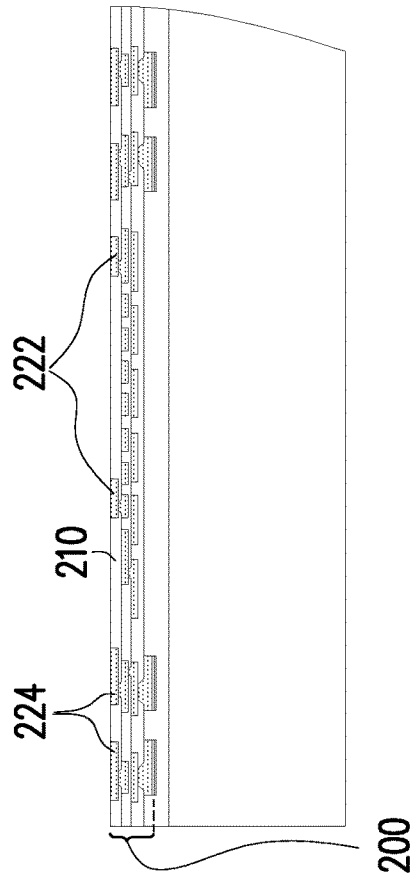

Referring to FIG. 1C and FIG. 1D, the ultra-thin redistribution structure 200 and the conductive layer 102 are transferred to a second temporary carrier 50a after performing the open circuit test. A material of second temporary carrier 50a may be similar as the material of first temporary carrier 50, which have suitable CTE for controlling warpage. In some embodiments, a release layer 52a, similar with the release layer 52, may be formed on the second temporary carrier 50a. After transferring the ultra-thin redistribution structure 200 onto the second temporary carrier 50a, the conductive pads 2241 of the second conductive pattern 224 and the first metallic layer 226 formed on the conductive pads 2241 may be embedded in the release layer 52a.

In some embodiments, after performing the open circuit test, the first temporary carrier 50 may be removed. For example, after transferring the ultra-thin redistribution structure 200 onto the second temporary carrier 50a, the external energy such as UV laser, visible light or heat, may be applied to the release layer 52 so that the first temporary carrier 50 may be peeled off toward the direction as the arrows shown in FIG. 1C indicated. After removing the first temporary carrier 50, the ultra-thin redistribution layer 200 and the conductive layer 102 stacked on the ultra-thin redistribution layer 200 are disposed on the second temporary carrier 50a. Since the first temporary carrier 50 is removed, the conductive layer 102 is exposed. Subsequently, the conductive layer 102 may be removed from the ultra-thin redistribution structure 200 though an etching process, or other suitable process. In some other embodiments, the conductive layer 102 may be removed with the first temporary carrier 50 in the same process.

After removing the conductive layer 102, the second temporary carrier 50a and the ultra-thin redistribution structure 200 attached thereon may be flipped upside down, as shown in FIG. 1D, such that a surface 200a of the ultra-thin redistribution structure 200 faces upwardly to perform the subsequent processes. In some embodiments, after removing the conductive layer 102 by such as an etching process, the first conductive pattern 222 and the second conductive pattern 224 on the surface 200a may be slightly lower (e.g., 1 μm to 3 μm approximately) than the dielectric layer 210 on the surface 200a.

Figure 1E:
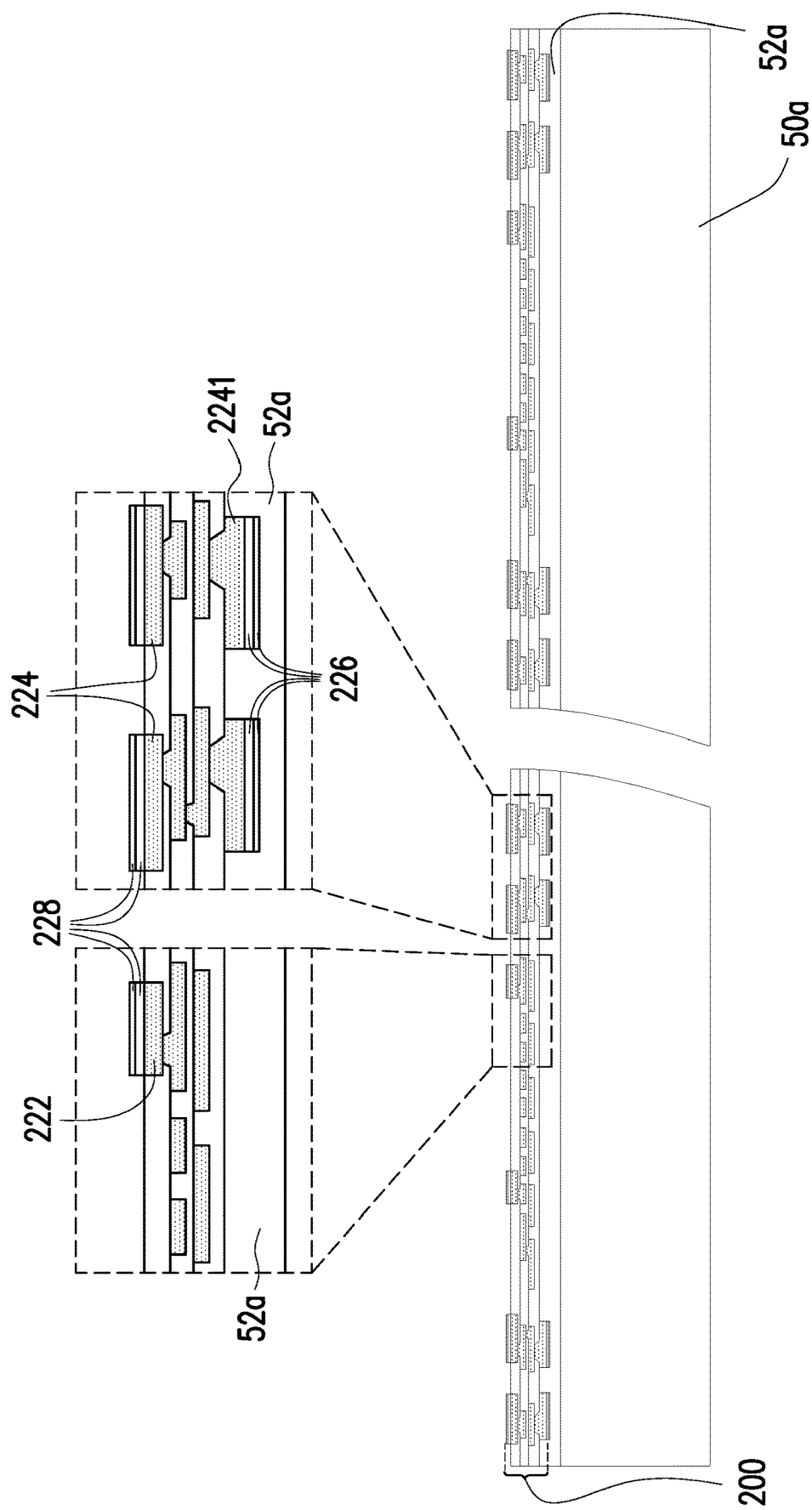

Referring to FIG. 1E, after removing the conductive layer 102, a second metallic layer 228 may be formed on the first conductive pattern 222 and the second conductive pattern 224. In some embodiments, the second metallic layer 228 is referred as the surface finish. For example, electroless nickel electroless palladium immersion gold (ENEPIG), nickel gold (Ni/Au), or the like, may be used as the second metallic layer 228 to increase the bondability of the first conductive pattern 222 and the second conductive pattern 224 for further electrical connection (e.g., wire bonding process). After forming the second metallic layer 228, one end of the second conductive pattern 224 may be covered by the second metallic layer 228, and the opposite end of the second conductive pattern 224 where the conductive pads 2241 are located is covered by the first metallic layer 226.

In some embodiments, after removing the conductive layer 102, a short test or automated optical inspection (AOI) may be performed by a short circuit tester or an automatic optical inspector in order to inspect the ultra-thin redistribution structure 200. Since the open/short test or the AOI is performed prior to the subsequent chip mounting process, the defects of the ultra-thin redistribution structure 200 can be found in the early stage, the die loss issue may be eliminated, thereby improving the yield of semiconductor package. In some embodiments, a sawing process may be performed to facilitate the subsequent processes. For example, a panel-level of the ultra-thin redistribution structure 200 may be cut to form a plurality of strip-level ultra-thin redistribution structures (not illustrated).

Figure 1F:
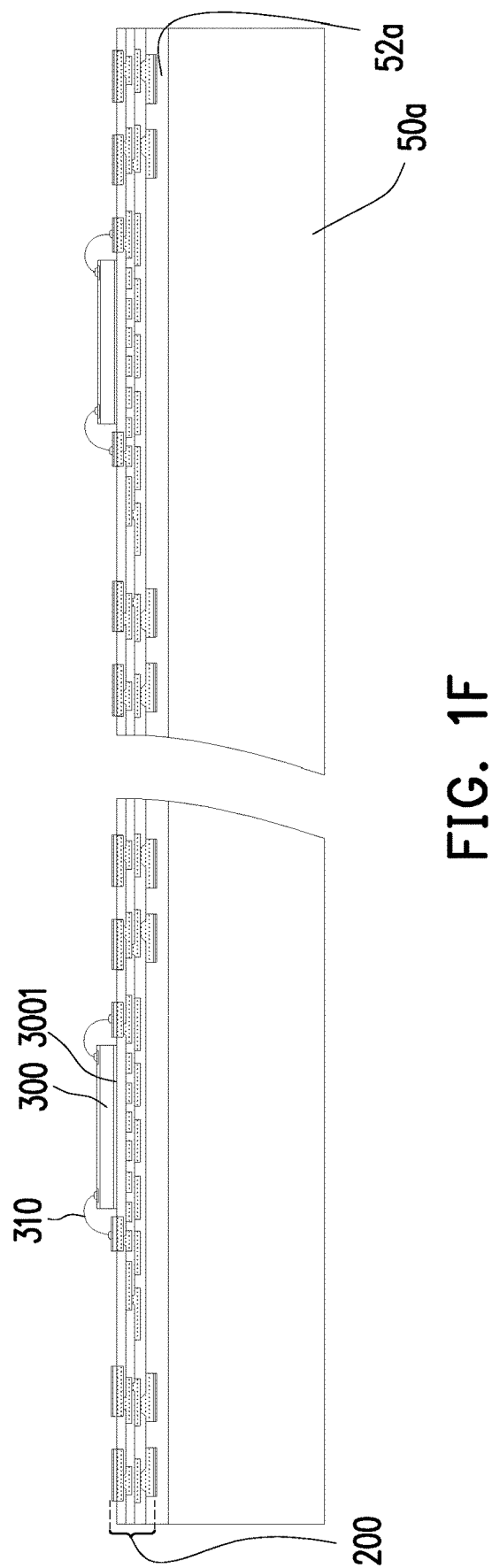

Referring to FIG. 1F, after performing the circuit test (e.g. open/short test or AOI), a semiconductor die 300 is disposed on the ultra-thin redistribution structure 200. In some embodiments, the semiconductor die 300 may be used to perform logic applications. However, it construes no limitation in the disclosure. Other suitable active devices may also be utilized as the semiconductor die 300. In some embodiments, the semiconductor die 300 may be electrically coupled to the first conductive pattern 222 of the ultra-thin redistribution structure 200 through a wire bonding process. For example, a plurality of first conductive wires 310 is formed to connect between the semiconductor die 300 and the ultra-thin redistribution structure 200. A material of the first conductive wires 310 may include gold, aluminium, or other suitable conductive materials. In some embodiments, a die attach film 3001 may be disposed between the semiconductor die 300 and the ultra-thin redistribution structure 200 to prevent the semiconductor die 300 from being detached during the wire bonding process.

Figure 1G:
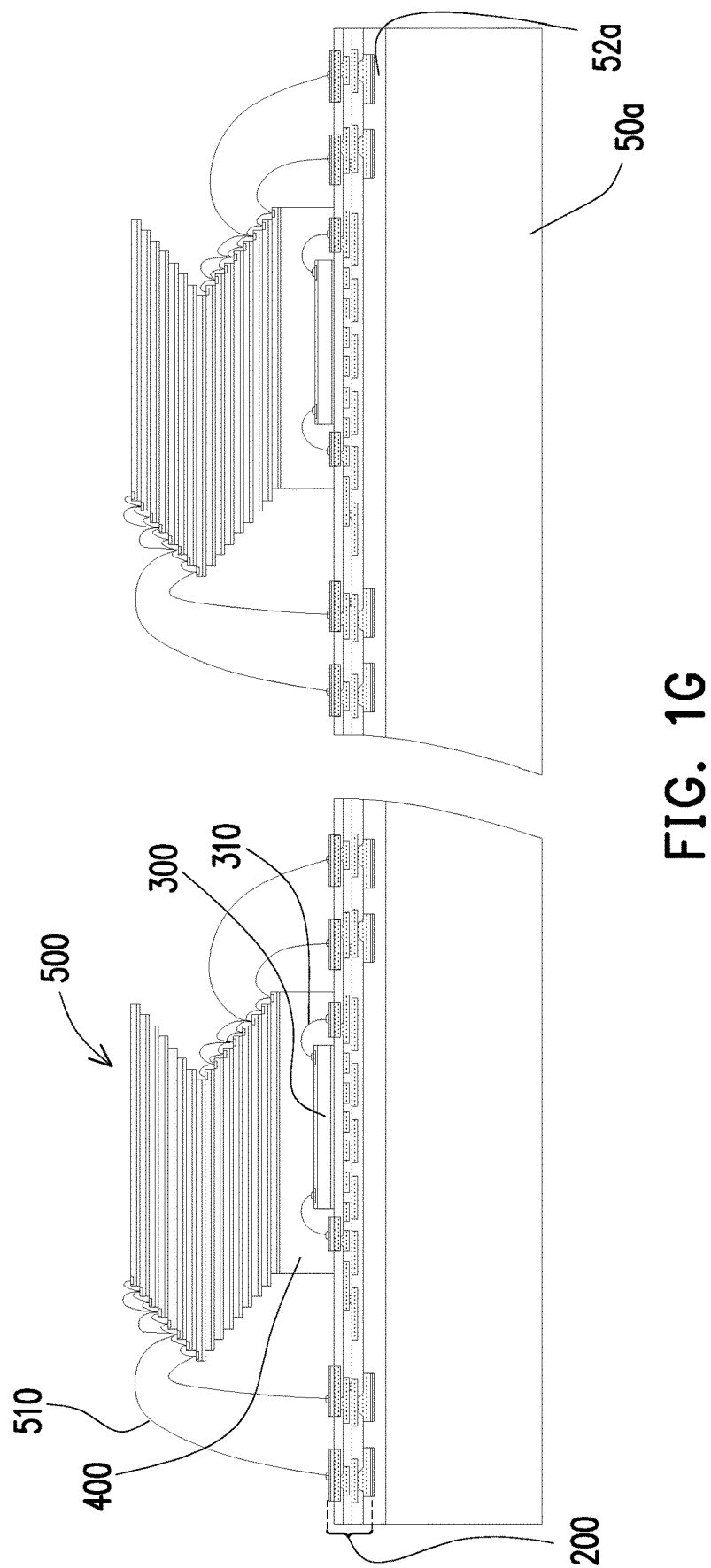

Referring to FIG. 1G, a semiconductor chip stack 500 and a first insulating encapsulant 400 are formed on the ultra-thin redistribution structure 200. The first insulating encapsulant 400 may be formed on the backside of the semiconductor chip stack 500 to encapsulate the semiconductor die 300, and the semiconductor chip stack 500 may be electrically coupled to the ultra-thin redistribution structure 200. For example, the first insulating encapsulant 400 includes a die attach film, a film over die (FOD), a film over wire (FOW), or other suitable insulating material. The semiconductor chip stack 500 may include memory chips which constitute a non-volatile memory, such as a NAND flash. In some embodiments, the facilitating the subsequent processes may be electrically coupled to the second conductive pattern 224 of the ultra-thin redistribution structure 200 through a wire bonding process. For example, after disposing the semiconductor chip stack 500 on the first insulating encapsulant 400, a plurality of second conductive wires 510 is formed to connect between the semiconductor chip stack 500 and the ultra-thin redistribution structure 200. A material of the second conductive wires 510 may be similar as the first conductive wires 310, which is not limited thereto.

Figure 1H:
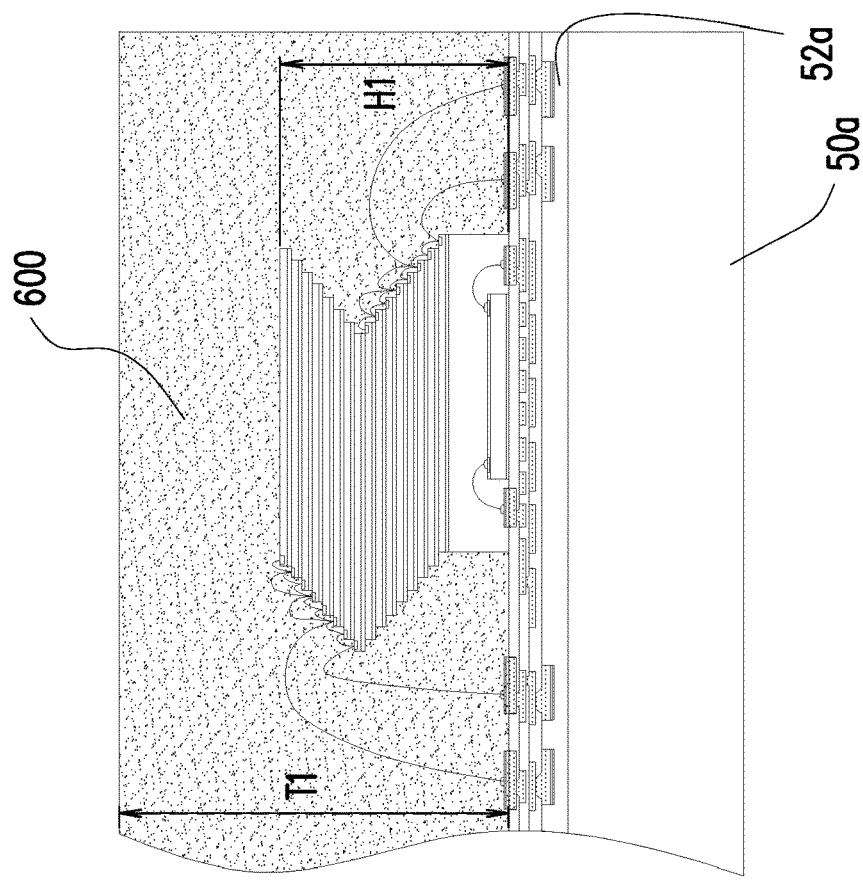

Referring to FIG. 1H, after disposing the semiconductor chip stack 500, a second insulating encapsulant 600 is formed on the ultra-thin redistribution structure 200 to encapsulate the semiconductor chip stack 500, the second conductive wires 510 and the first insulating encapsulant 400 for providing physical support and electrical isolation. In some embodiments, the material of the second insulating encapsulant 600 is different from that of the first insulating encapsulant 400. For example, a material of the second insulating encapsulant 600 may be selected to have a low moisture absorption rate. In some embodiments, a material of the second insulating encapsulant 600 may be epoxy, molding compound, or other suitable insulating materials. The second insulating encapsulant 600 may be formed using processes such as compression molding, transfer molding, or other encapsulation processes. In some embodiments, after forming the second insulating encapsulant 600, the thickness T1 of the second insulating encapsulant 600 may be greater than the height H1 of top of the semiconductor chip stack 500 measured from the ultra-thin redistribution structure 200. The first conductive pattern 222 may be covered by the first insulating encapsulant 400 and the second conductive pattern 224 may be covered by the second insulating encapsulant 600.

Figure 1I:
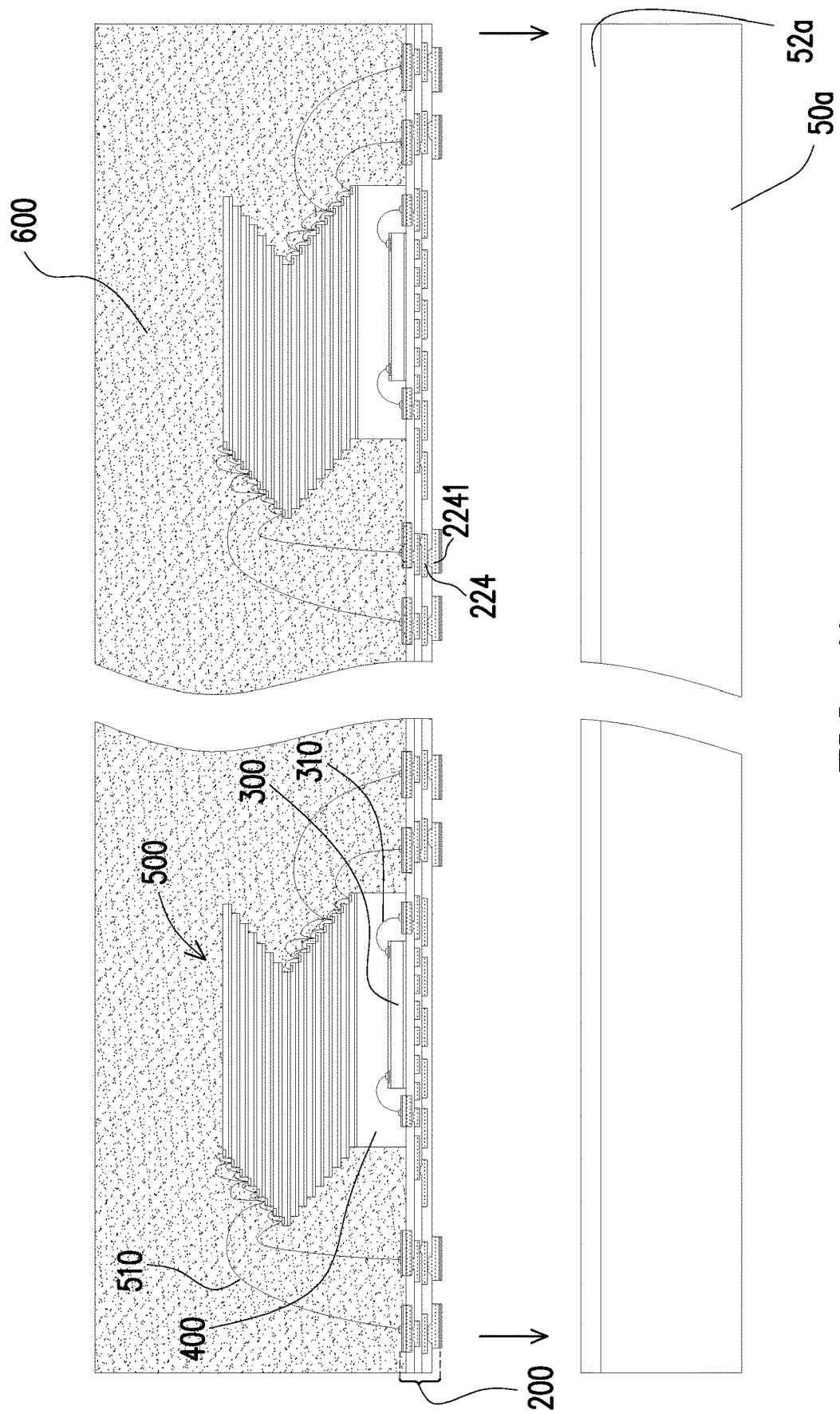

Referring to FIG. 1I, the second temporary carrier 50a is removed from the ultra-thin redistribution structure 200 after forming the second insulating encapsulant 600. In some embodiments, the second temporary carrier 50a may be removed toward the direction as the arrows shown in FIG. 1I indicated. The removing process of the second temporary carrier 50a may be similar as removing the first temporary carrier 50, and the detailed descriptions are not repeated for brevity. In some embodiments, the conductive pads 2241 on the second conductive pattern 224 of the ultra-thin redistribution structure 200 may be exposed after removing the second temporary carrier 50a for further electrical connection.

Figure 1J:
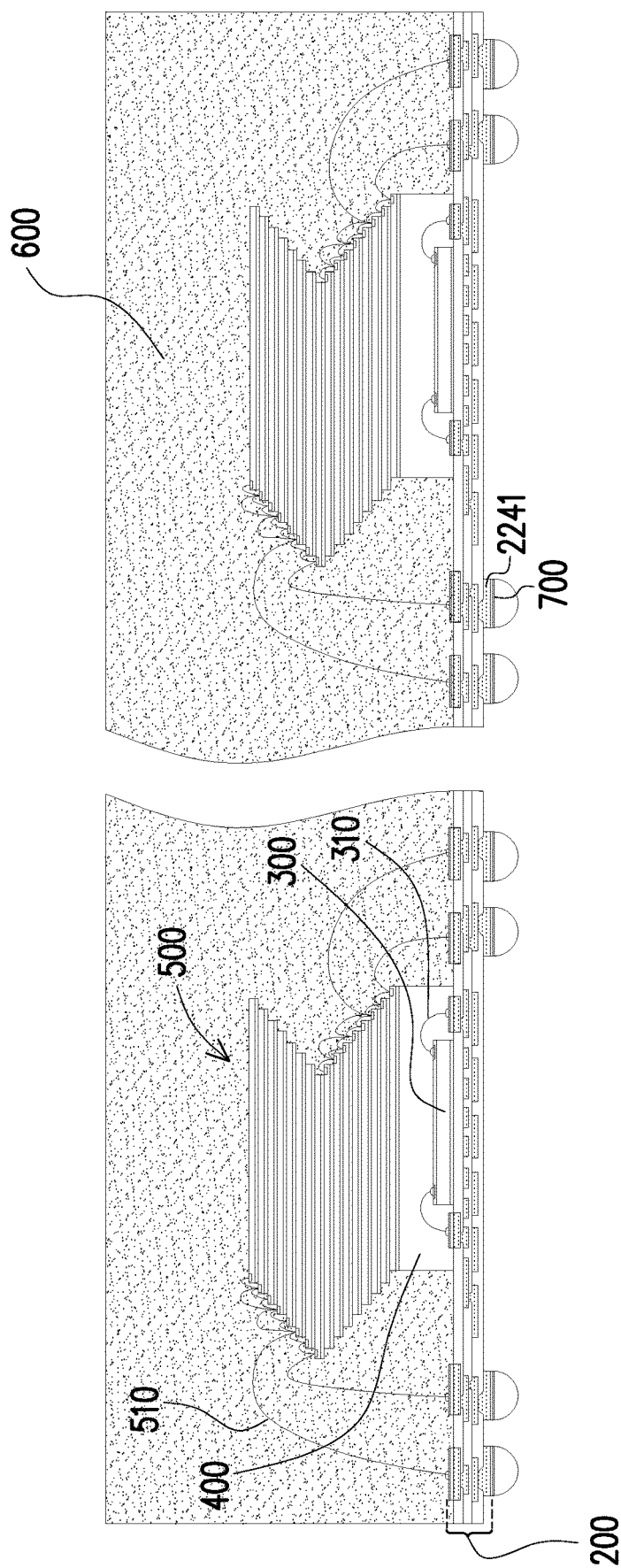

Referring to FIG. 1J, a plurality of conductive terminals 700 is formed on the ultra-thin redistribution structure 200 opposite to the semiconductor die 300 and electrically coupled to the ultra-thin redistribution structure 200. For example, after removing the second temporary carrier 50a to expose the conductive pads 2241, the conductive terminals 700 is formed on the conductive pads 2241 of the second conductive pattern 224. A material of the plurality of conductive terminals 700 may include copper, tin, gold, nickel or other suitable conductive materials. The conductive terminals 700 may be conductive bumps, conductive pillars, or solder balls formed by a ball placement, a plating process, or other suitable process. It should be noted that other possible forms and shapes of the conductive terminals 700 may be utilized. A reflowing process is optionally performed for enhancement of the adhesion between the conductive terminals 700 and the ultra-thin redistribution structure 200. In some embodiments, the conductive terminals 700 may form an array arranged to have fine pitch on the conductive pads 2241 of the ultra-thin redistribution structure 200 according to the design requirement. In some embodiments, the conductive pads 2241 which the conductive terminals are formed on may be referred as the ball pads.

Figure 1K:
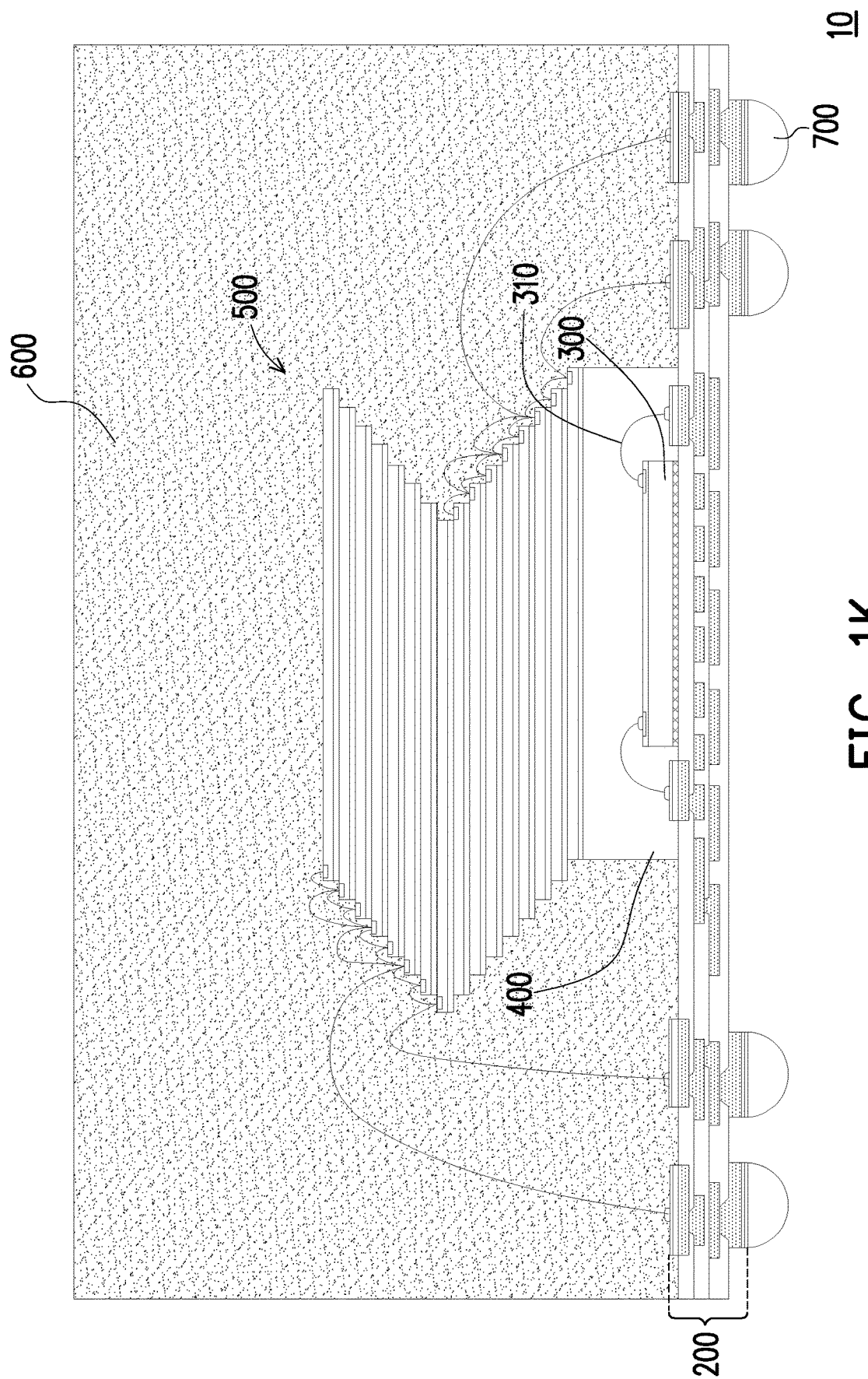

Referring to FIG. 1K, after forming the conductive terminals 700, a singulation process is performed to form individual packages, and the manufacturing process of a semiconductor package 10 is substantially completed. The singulation process may include cutting with rotating blade, laser beam, or other suitable means. After singulation, the semiconductor die 300 and the first conductive wires 310 may be encapsulated by the first insulating encapsulant 400, and the semiconductor chip stack 500, the second conductive wires 510 and the first insulating encapsulant 400 may be encapsulated by the second insulating encapsulant 600. The second insulating encapsulant 600 may provide mechanical protection, electrical and environmental isolation, thereby increasing the reliability and throughput of the semiconductor package 10. The z-height of the semiconductor package 10 may be reduced by an amount corresponding to the thickness of ultra-thin redistribution structure 200. For example, the z-height of the semiconductor package 10 may be less than about 800 µm, thereby achieving miniaturization of the semiconductor package 10.

FIG. 2A to FIG. 2G are schematic cross-sectional views illustrating a manufacturing method of a semiconductor package according to another embodiment of the disclosure. The manufacturing method of the present embodiment is similar to the manufacturing method shown in FIG. 1A to FIG. 1K. The identical or similar numbers refer to the identical or similar elements throughout the drawings, and detail thereof is not repeated.

Figure 2A:
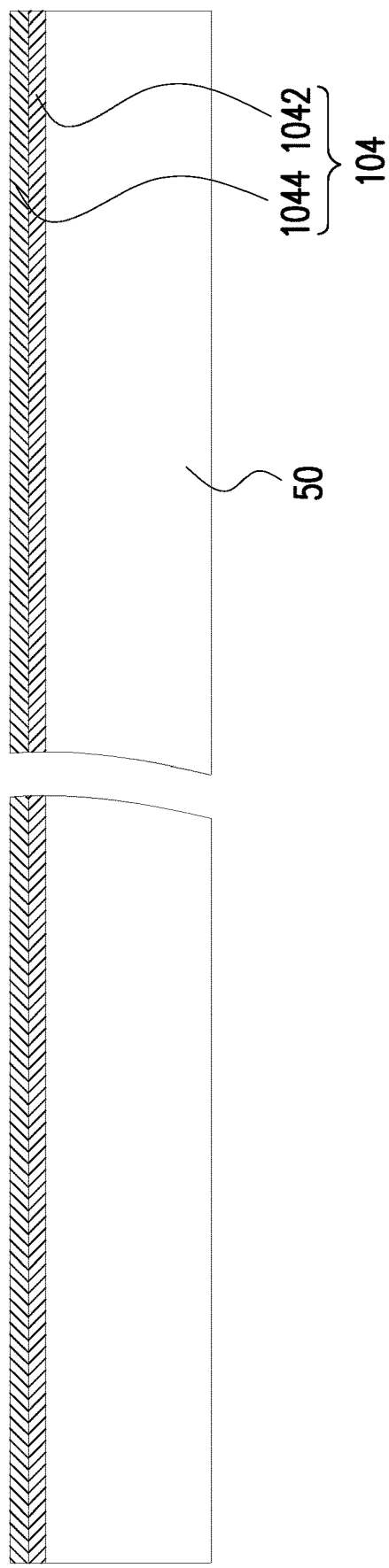
FIG. 2A to FIG. 2G are schematic cross-sectional views illustrating a manufacturing method of a semiconductor package according to another embodiment of the disclosure.
Figure 2B:
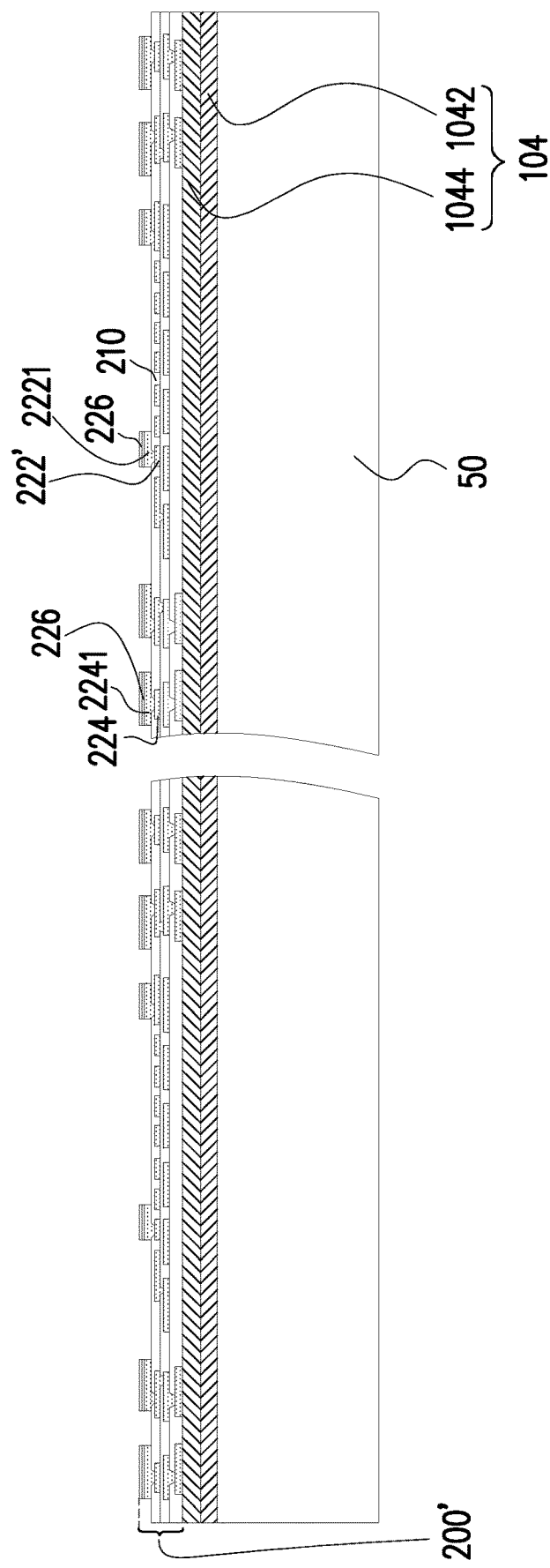

Referring to FIG. 2A and FIG. 2B, a conductive layer 104 is formed on the temporary carrier 50. In some embodiments, the conductive layer 104 may be a double-layer conductive material 104 formed on the temporary carrier 50 using a laminating process, or other suitable process. For example, the double-layer conductive material 104 may include a first portion 1042 in contact with the temporary carrier 50 and a second portion 1044 disposed on the first portion 1042 opposite to the temporary carrier 50. In some embodiments, the first portion 1042 and the second portion 1044 may be copper foil which may be used as the seed layer in the course of forming the ultra-thin redistribution structure 200'. After forming the conductive layer 104, the ultra-thin redistribution structure 200' is formed on the second portion 1044 of the double-layer conductive material 104 as shown in FIG. 2B.

The forming process of the ultra-thin redistribution structure 200' in the present embodiment is similar as described in FIG. 1B. The differences lie in that the first conductive pattern 222' and the second conductive pattern 224 may respectively include a plurality of conductive pads 2221 and 2241 disposed on the topmost dielectric layer 210. The conductive pads 2221 of the first conductive pattern 222' may be formed in the same process with the conductive pads 2241 of the second conductive pattern 224. In some embodiment, the first metallic layer 226 may be formed on the conductive pads 2241 of the second conductive pattern 224' and the conductive pads 2221 of the first conductive pattern 222 for the subsequent wire bonding process.

After forming the ultra-thin redistribution structure 200', the double-layer conductive material 104 (i.e. the conductive layer) is electrically coupled to the first conductive pattern 222 and the second conductive pattern 224, and the circuit test (e.g. the open circuit test) may be performed to detect the electrical discontinuity of the ultra-thin redistribution structure 200' through the double-layer conductive material 104. In the present embodiment, since the structure is formed on the temporary carrier 50 without additional carrier transfer bonding process, the electrical test at this stage may check the open circuit issue only, and the short test (e.g., trace bridge) may be inspected by AOI in a later stage of the process. In some embodiments, a sawing process may be performed to facilitate the subsequent processes. For example, a panel-level of the ultra-thin redistribution structure 200' may be cut to form a plurality of strip-level ultra-thin redistribution structures (not illustrated).

Figure 2C:
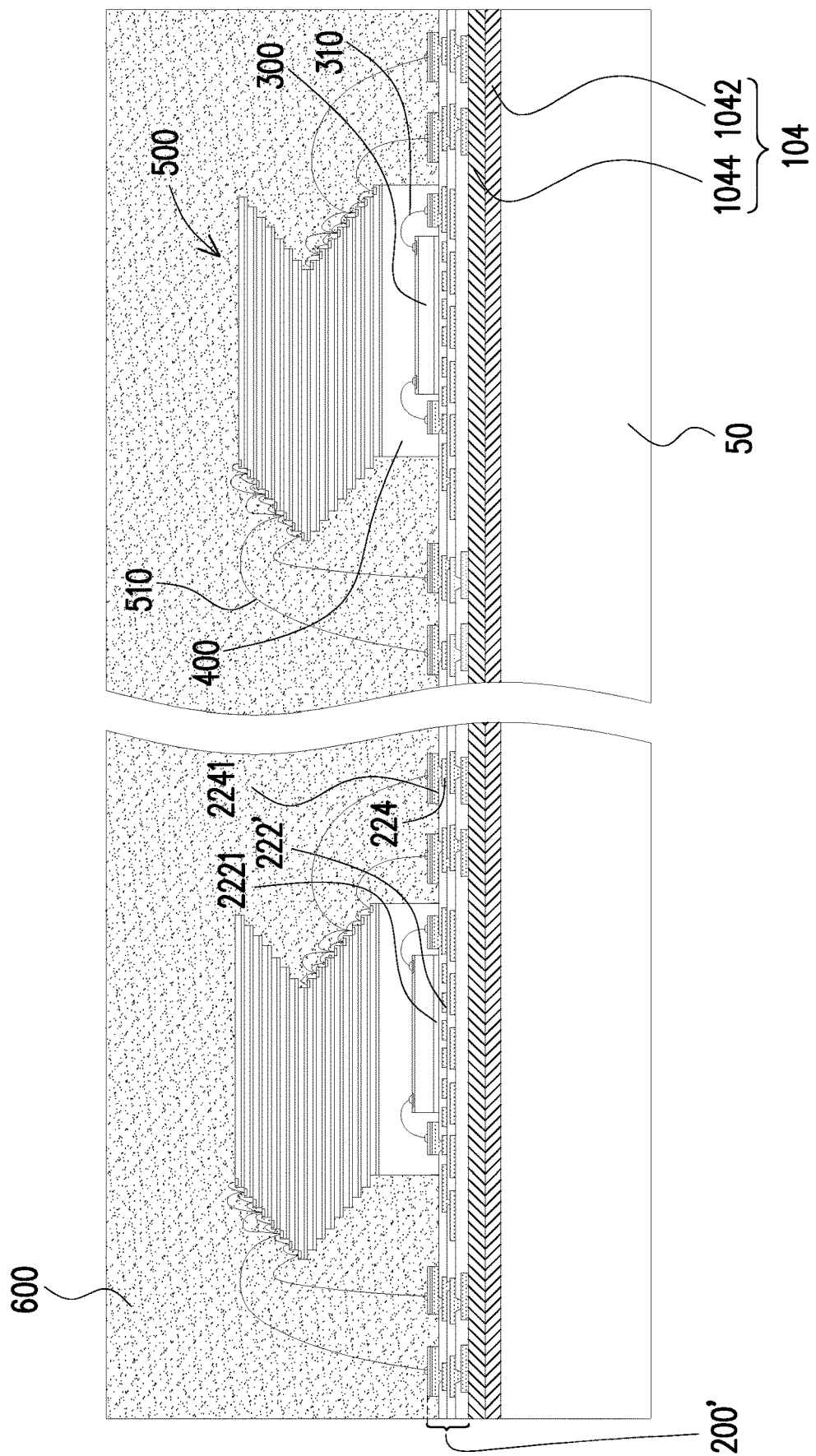

Referring to FIG. 2C, after performing the open circuit test, the semiconductor die 300 is disposed on the ultra-thin redistribution structure 200'. Next, the first conductive wires 310 are formed on the conductive pads 2221 of the first conductive pattern 222' to electrically couple between the ultra-thin redistribution structure 200' and the semiconductor die 300. The subsequent processes may be similar as described in FIG. 1F to FIG. 1H. The semiconductor chip stack 500 and the first insulating encapsulant 400 on the backside of the semiconductor chip stack 500 may be formed on the ultra-thin redistribution structure 200'. The first insulating encapsulant 400 may encapsulate the semiconductor die 300, the first conductive wires 310 and the conductive pads 2221 of the first conductive pattern 222'. Next, the second conductive wires 510 may be formed on the conductive pads 2241 of the second conductive pattern 224 to electrically couple to the ultra-thin redistribution structure 200' and the semiconductor chip stack 500. Thereafter, the second insulating encapsulant 600 is formed on the ultra-thin redistribution structure 200' to encapsulate the semiconductor chip stack 500, the second conductive wires 510, the conductive pads 2241 of the second conductive pattern 224 and the first insulating encapsulant 400.

Figure 2D:
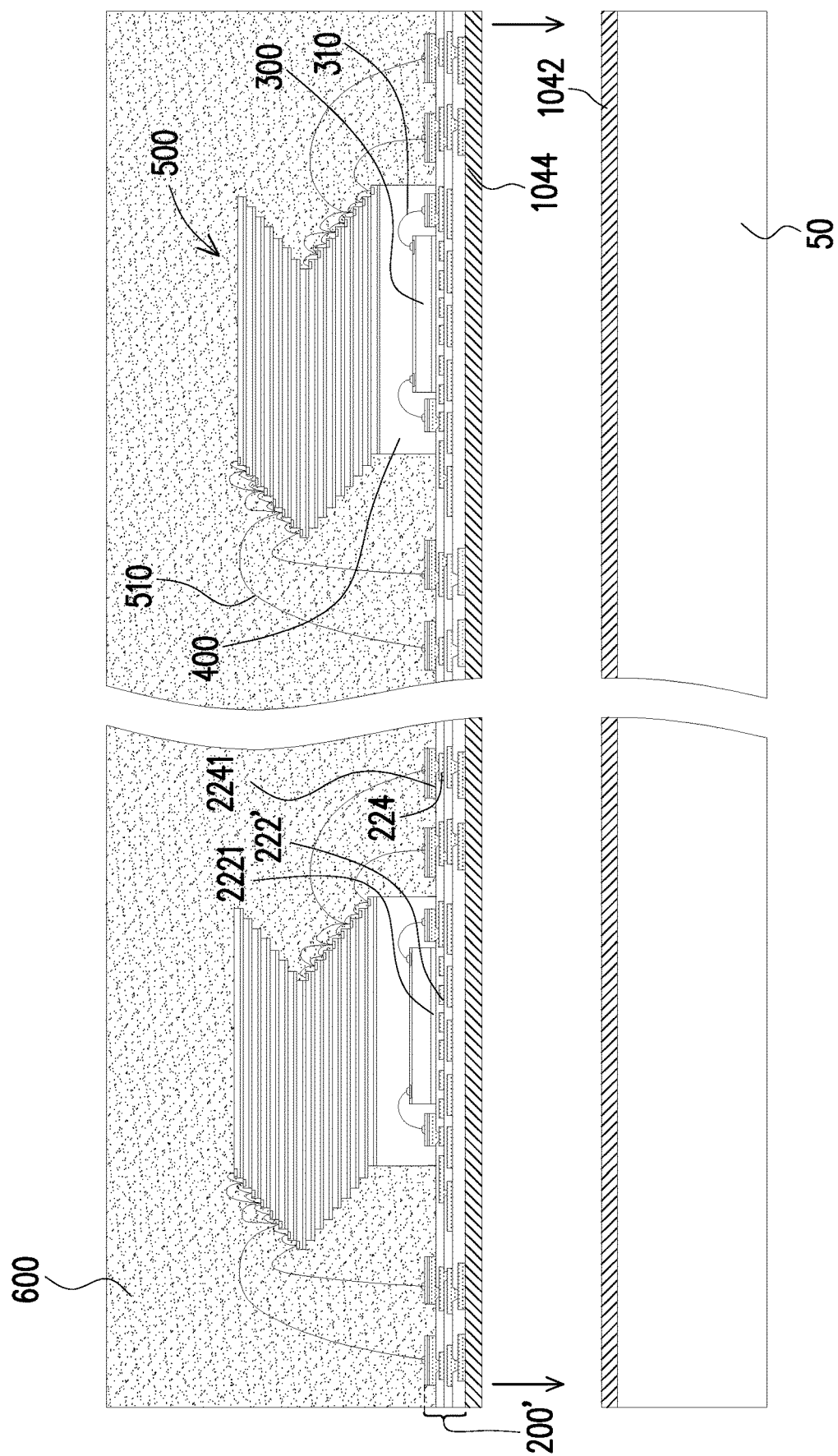

Referring to FIG. 2D, after forming the second insulating encapsulant 600, the first portion 1042 of the double-layer conductive material 104 and the temporary carrier 50 are removed from the second portion 1044 of the double-layer conductive material 104. In some embodiments, removing the first portion 1042 of the double-layer conductive material 104 and the temporary carrier 50 may be performed to the interface between the first portion 1042 and the second portion 1044 by physical treatment such as laser lift-off process, chemical treatment such as chemical etching, or other suitable process, but the disclosure is not limited thereto. After removing the first portion 1042, the second portion 1044 of the double-layer conductive material 104 may be exposed.

Figure 2E:
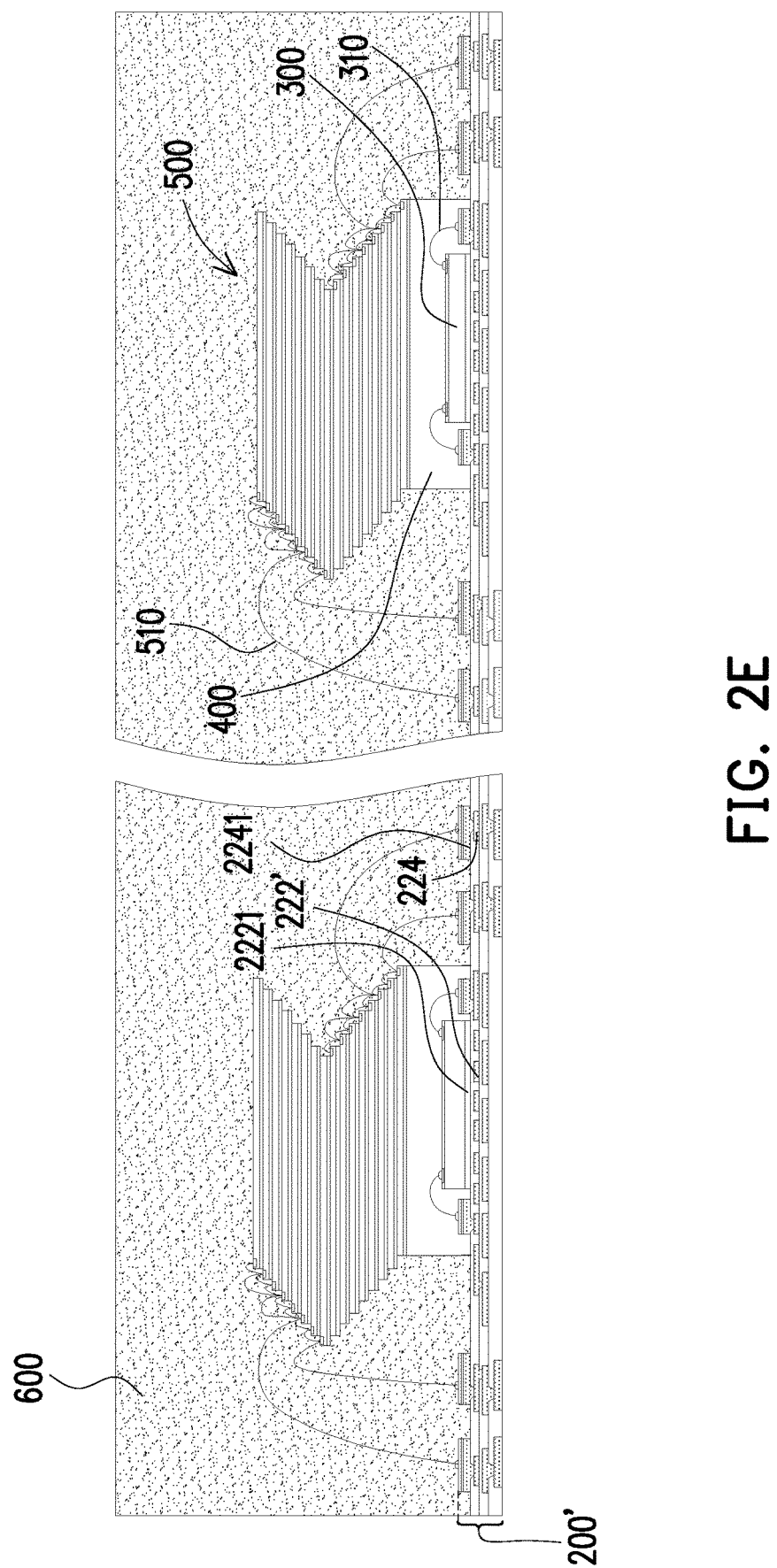

Referring to FIG. 2E, after separating the first portion 1042 and the second portion 1044 of the double-layer conductive material 104, the second portion 1044 is removed to expose the ultra-thin redistribution structure 200 by an etching process, or other suitable process. In some other embodiments, the second portion 1044 may be removed with the first portion 1042 and the temporary carrier 50 in the same process. After removing the second portion 1044 of the double-layer conductive material 104, the first conductive pattern 222 and the second conductive pattern 224' are exposed.

Figure 2F:
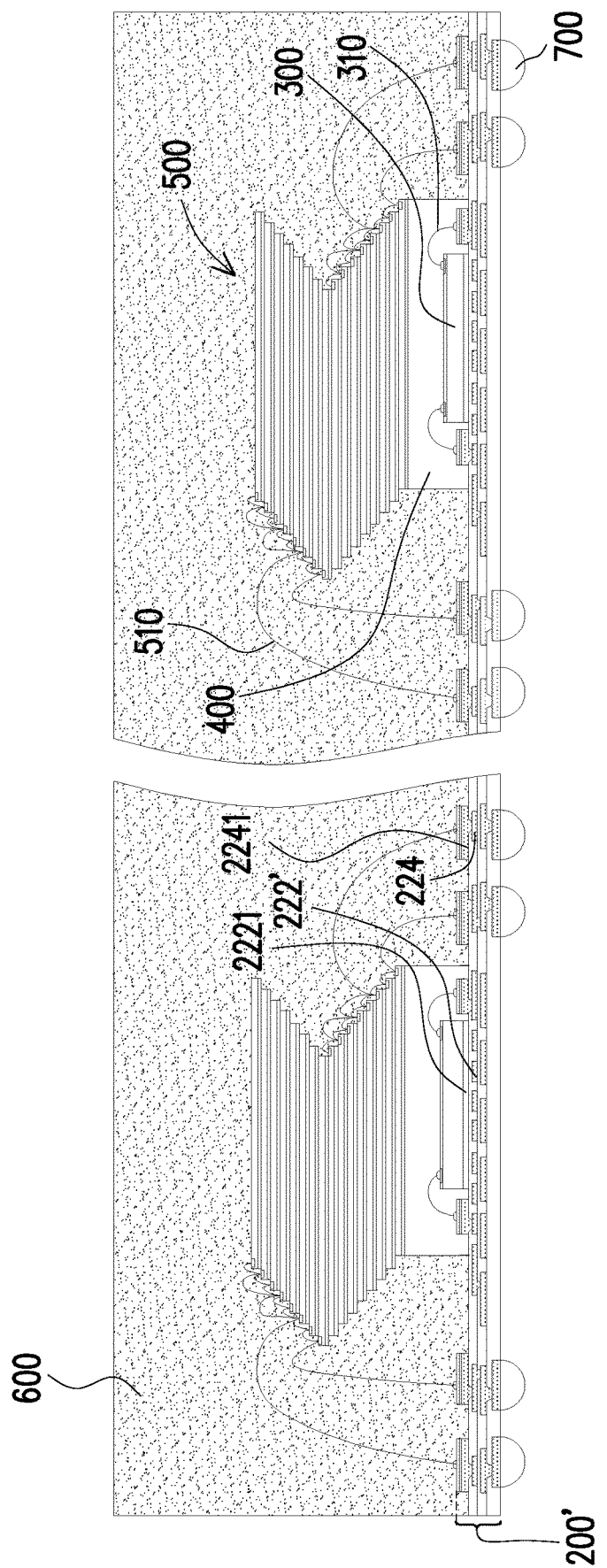

Referring to FIG. 2F, after removing the second portion 1044 of the double-layer conductive material 104, the conductive terminals 700 are formed on the ultra-thin redistribution structure 200' opposite to the semiconductor die 300. For example, the conductive terminals 700 may be formed on the second conductive pattern 224 to electrically couple to the semiconductor die 300 through the ultra-thin redistribution structure 200'. The forming process of the conductive terminals 700 may be similar as the process described in FIG. 1J, and the detailed descriptions are omitted for brevity.

Figure 2G:
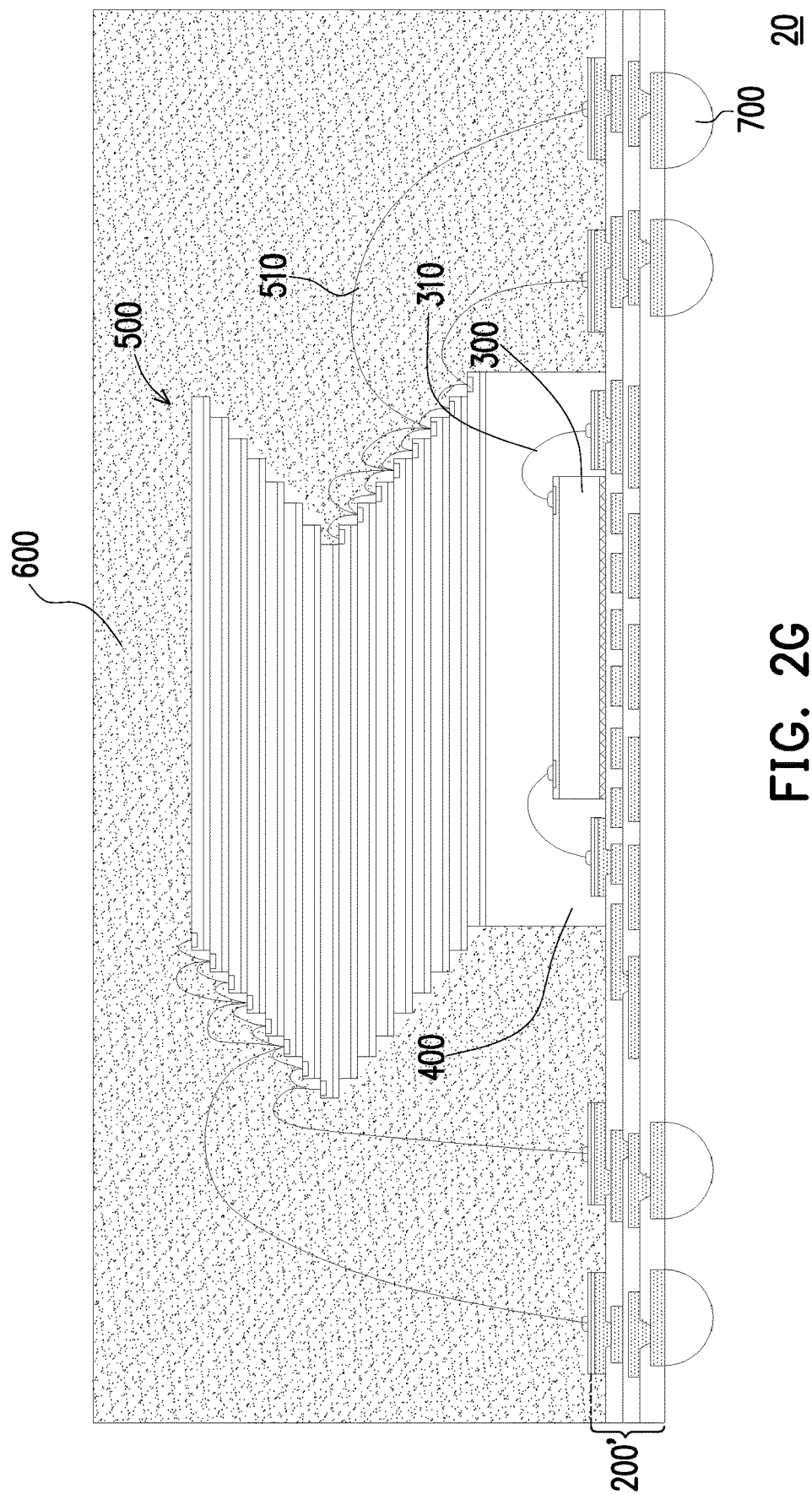

Referring to FIG. 2G, after forming the conductive terminals 700, a singulation process is performed to form individual packages, and the manufacturing process of a semiconductor package 20 is substantially completed. The singulation process may be similar to the process described in FIG. 1K, and the detailed descriptions are omitted for brevity. After singulation, the semiconductor die 300, the first conductive wires 310 and the conductive pads 2221 of the first conductive pattern 222' may be encapsulated by the first insulating encapsulant 400, and the semiconductor chip stack 500, the second conductive wires 510, the conductive pads 2241 of the second conductive pattern 224 and the first insulating encapsulant 400 may be encapsulated by the second insulating encapsulant 600.

Based on the above, the ultra-thin redistribution structure of the semiconductor package provides the fan-out electrical connection function with thinner structure and finer L/S dimension. Moreover, the ultra-thin redistribution structure is formed on the conductive layer, and the circuit test (e.g. the open test) is performed, thereby detecting the electrical discontinuity of the ultra-thin redistribution structure. The short circuit test or the AOI may be executed prior to disposing the semiconductor die such that the defects of the ultra-thin redistribution structure can be found in the early stage, thereby avoiding die loss and improving the yield of semiconductor package. In addition, the second insulating encapsulant having a material property of low moisture absorption rate may provide mechanical protection, electrical and environmental isolation, thereby increasing the reliability performance of the semiconductor package.

It will be apparent to those skilled in the art that various modifications and variations can be made to the structure of the disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of a semiconductor package, comprising:

forming an ultra-thin redistribution structure and performing a circuit test on the ultra-thin redistribution structure, wherein forming the ultra-thin redistribution structure and performing the circuit test on the ultra-thin redistribution structure comprise:
forming a conductive layer;
forming the ultra-thin redistribution structure on the conductive layer;
performing an open circuit test on the ultra-thin redistribution structure through the conductive layer; and
removing the conductive layer after performing the open circuit test;
disposing a semiconductor die on the ultra-thin redistribution structure to electrically couple to the ultra-thin redistribution structure;
forming a semiconductor chip stack and a first insulating encapsulant on the ultra-thin redistribution structure, wherein the first insulating encapsulant is formed on a backside of the semiconductor chip stack to encapsulate the semiconductor die, and the semiconductor chip stack is electrically coupled to the ultra-thin redistribution structure; and
forming a second insulating encapsulant on the ultra-thin redistribution structure to encapsulate the semiconductor chip stack and the first insulating encapsulant.

2. The manufacturing method according to claim 1, wherein performing the circuit test on the ultra-thin redistribution structure further comprises:
performing a short circuit test or automated optical inspection on the ultra-thin redistribution structure after removing the conductive layer.

3. The manufacturing method according to claim 1, wherein the conductive layer is formed on a first temporary carrier, and the first temporary carrier is removed after performing the open circuit test and before removing the conductive layer.

4. The manufacturing method according to claim 3, wherein the ultra-thin redistribution structure and the conductive layer is transferred to a second temporary carrier after performing the open circuit test, and the ultra-thin redistribution structure is disposed on the second temporary carrier when removing the conductive layer from the ultra-thin redistribution structure.

5. The manufacturing method according to claim 4, wherein the second temporary carrier is removed after forming the second insulating encapsulant.

6. The manufacturing method according to claim 1, wherein forming the conductive layer comprises:
laminating a double-layer conductive material on a temporary carrier, wherein the double-layer conductive material comprises a first portion in contact with the temporary carrier and a second portion disposed on the first portion opposite to the temporary carrier.

7. The manufacturing method according to claim 6, wherein after forming the second insulating encapsulant, removing the first portion of the double-layer conductive material and the temporary carrier.

8. The manufacturing method according to claim 7, wherein after removing the first portion of the double-layer conductive material and the temporary carrier, removing the second portion of the double-layer conductive material to expose the ultra-thin redistribution structure.

9. The manufacturing method according to claim 1, wherein after disposing the semiconductor die on the ultra-thin redistribution structure, forming a plurality of first conductive wires to electrically couple to the semiconductor die and the ultra-thin redistribution structure.

10. The manufacturing method according to claim 1, wherein after disposing the semiconductor chip stack on the first insulating encapsulant, forming a plurality of second conductive wires to electrically couple to the semiconductor chip stack and the ultra-thin redistribution structure.

11. The manufacturing method according to claim 1, wherein forming the ultra-thin redistribution structure comprises:
forming a dielectric layer, wherein a Young's modulus of the dielectric layer ranges from 2.0 GPa to 4.0 GPa; and
forming a first conductive pattern and a second conductive pattern,
wherein the semiconductor die is electrically coupled to the first conductive pattern of the ultra-thin redistribution structure after disposing the semiconductor die, and the semiconductor chip stack is electrically coupled to the second conductive pattern of the ultra-thin redistribution structure after disposing the semiconductor chip stack.

12. A manufacturing method of a semiconductor package, comprising:
performing a circuit test on an ultra-thin redistribution structure, wherein a Young's modulus of a dielectric layer of the ultra-thin redistribution structure ranges from 2.0 GPa to 4.0 GPa;
disposing a semiconductor die on the ultra-thin redistribution structure to electrically couple to a first conductive pattern of the ultra-thin redistribution structure;
forming a semiconductor chip stack and a first insulating encapsulant on the ultra-thin redistribution structure, wherein the first insulating encapsulant is formed on a backside of the semiconductor chip stack to encapsulate the semiconductor die, and the semiconductor chip stack is electrically coupled to a second conductive pattern of the ultra-thin redistribution structure different from the first conductive pattern of the ultra-thin redistribution structure; and
forming a second insulating encapsulant on the ultra-thin redistribution structure to encapsulate the semiconductor chip stack and the first insulating encapsulant.

* * * * *